(12) United States Patent
    Cho

(10) Patent No.: US 11,495,578 B2
(45) Date of Patent: Nov. 8, 2022

(54) SEMICONDUCTOR PACKAGE AND POP TYPE PACKAGE

(71) Applicant: Samsung Electronics Co., Ltd., Suwon-si (KR)

(72) Inventor: Youngsang Cho, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 17/038,946

(22) Filed: Sep. 30, 2020

(65) Prior Publication Data

US 2021/0151411 A1    May 20, 2021

(30) Foreign Application Priority Data

Nov. 15, 2019    (KR) .................. 10-2019-0146960

(51) Int. Cl.
   *H01L 25/065*    (2006.01)
   *H01L 23/00*    (2006.01)
   (Continued)

(52) U.S. Cl.
   CPC ........ *H01L 25/0657* (2013.01); *H01L 23/291* (2013.01); *H01L 23/293* (2013.01);
   (Continued)

(58) Field of Classification Search
   CPC . H01L 25/0657; H01L 24/20; H01L 23/3677; H01L 23/3733; H01L 23/3135; H01L 23/3128; H01L 25/18; H01L 25/105; H01L 2225/06513; H01L 2225/06517; H01L 2225/06541; H01L 2924/15311; H01L 2225/1023; H01L 2225/1041; H01L 2225/1058; H01L 2225/1094; H01L 2224/16227; H01L 2224/32225; H01L 2224/73204; H01L 2924/15331; H01L 2224/73253; H01L 23/3737;
   (Continued)

(56) References Cited

U.S. PATENT DOCUMENTS 7,932,596 B2    4/2011 Mallik et al.
8,718,550 B2    5/2014 Zhao et al.
(Continued)

FOREIGN PATENT DOCUMENTS

JP        5135828 B2    2/2013

OTHER PUBLICATIONS

Office Action dated Jul. 22, 2022, issued in corresponding German Patent Application No. 102020126947.1.

*Primary Examiner* — Ahmed N Sefer
(74) *Attorney, Agent, or Firm* — Harness, Dickey & Pierce, P.L.C.

(57) ABSTRACT

A semiconductor package includes: a first package substrate; a first semiconductor device mounted on the first package substrate; a second package substrate arranged on an upper part of the first semiconductor device; and a heat-dissipating material layer arranged between the first semiconductor device and the second package substrate and having a thermal conductivity of approximately 0.5 W/m·K to approximately 20 W/m·K, wherein the heat-dissipating material layer is in direct contact with an upper surface of the first semiconductor device and a conductor of the second package substrate.

19 Claims, 13 Drawing Sheets

(51) Int. Cl.

| | |
|---|---|
| *H01L 23/367* | (2006.01) |
| *H01L 23/373* | (2006.01) |
| *H01L 23/498* | (2006.01) |
| *H01L 23/538* | (2006.01) |
| *H01L 23/29* | (2006.01) |
| *H01L 25/18* | (2006.01) |
| *H01L 25/10* | (2006.01) |
| *H01L 23/31* | (2006.01) |
| *H01L 23/525* | (2006.01) |
| *H01L 23/485* | (2006.01) |

(52) U.S. Cl.
CPC ...... *H01L 23/3128* (2013.01); *H01L 23/3135* (2013.01); *H01L 23/3672* (2013.01); *H01L 23/3677* (2013.01); *H01L 23/3733* (2013.01); *H01L 23/3737* (2013.01); *H01L 23/485* (2013.01); *H01L 23/49816* (2013.01); *H01L 23/49827* (2013.01); *H01L 23/49833* (2013.01); *H01L 23/525* (2013.01); *H01L 23/5384* (2013.01); *H01L 23/5385* (2013.01); *H01L 23/5389* (2013.01); *H01L 24/06* (2013.01); *H01L 24/20* (2013.01); *H01L 25/105* (2013.01); *H01L 25/18* (2013.01); *H01L 23/49822* (2013.01); *H01L 23/5383* (2013.01)

(58) Field of Classification Search
CPC ............. H01L 23/5383; H01L 23/5389; H01L 23/5384; H01L 23/5385; H01L 23/49816; H01L 23/49822; H01L 23/49833; H01L 23/49827; H01L 23/3672; H01L 23/525; H01L 23/485; H01L 24/06; H01L 23/291; H01L 23/293

See application file for complete search history.

(56) References Cited

U.S. PATENT DOCUMENTS

| | | | |
|---|---|---|---|
| 8,759,157 B2 | 6/2014 | Onodera | |
| 9,006,904 B2 | 4/2015 | Marais et al. | |
| 9,230,876 B2 | 1/2016 | Lee et al. | |
| 9,324,696 B2 | 4/2016 | Choi et al. | |
| 9,355,931 B2 | 5/2016 | Kim et al. | |
| 9,583,474 B2 | 2/2017 | Lin et al. | |
| 10,074,618 B1* | 9/2018 | Chen | H01L 24/19 |
| 10,854,530 B1* | 12/2020 | Cheng | H01L 25/18 |
| 2014/0327129 A1 | 11/2014 | Cho et al. | |
| 2014/0367860 A1 | 12/2014 | Im et al. | |
| 2015/0123257 A1* | 5/2015 | Lin | H01L 23/42 |
| | | | 257/787 |
| 2015/0152251 A1* | 6/2015 | Koshida | C08K 3/38 |
| | | | 523/223 |
| 2016/0190035 A1 | 6/2016 | Na et al. | |
| 2016/0254086 A1* | 9/2016 | Kim | H01F 27/22 |
| | | | 336/61 |
| 2016/0343592 A1* | 11/2016 | Costa | H01L 23/3135 |
| 2017/0263518 A1* | 9/2017 | Yu | H01L 24/16 |
| 2017/0294422 A1* | 10/2017 | Solimando | H01L 25/50 |
| 2018/0151501 A1* | 5/2018 | Yu | H01L 25/50 |
| 2018/0269127 A1* | 9/2018 | Hung | H01L 25/105 |
| 2019/0006257 A1* | 1/2019 | Hsu | H01L 23/3135 |
| 2019/0051621 A1* | 2/2019 | Liu | H01L 21/4853 |
| 2019/0096791 A1* | 3/2019 | Jeng | H01L 22/14 |
| 2019/0103385 A1 | 4/2019 | Karhade et al. | |
| 2019/0323785 A1* | 10/2019 | Eid | H01L 25/0655 |
| 2020/0161275 A1* | 5/2020 | Lin | H01L 23/3737 |
| 2020/0357770 A1* | 11/2020 | Chiang | H01L 24/19 |
| 2020/0365544 A1* | 11/2020 | Chen | H01L 24/17 |
| 2021/0013181 A1* | 1/2021 | Han | H01L 21/6835 |
| 2021/0225737 A1* | 7/2021 | Fang | H01L 23/3185 |

* cited by examiner

SEMICONDUCTOR PACKAGE AND POP TYPE PACKAGE

CROSS-REFERENCE TO RELATED APPLICATION

This application claims the benefit of Korean Patent Application No. 10-2019-0146960, filed on Nov. 15, 2019, in the Korean Intellectual Property Office, the disclosure of which is incorporated herein in its entirety by reference.

BACKGROUND

Inventive concepts relate to a semiconductor package and a package-on-package (PoP) type package, and more particularly, to a semiconductor package and a PoP type package both of which are capable of smoothly discharging heat generated from a semiconductor device located at a lower part thereof.

Along with the increase in the operating speed of a semiconductor element, heat generated from the semiconductor element has also increased. Unless the generated heat is smoothly dissipated from the semiconductor element, a semiconductor device including the semiconductor element may be damaged or the performance thereof may decrease. Therefore, there is demand for a method of quickly dissipating the generated heat from the semiconductor element to keep the reliability of the semiconductor element and enable a smooth operation of the semiconductor element. In particular, when heat generated from a lower package in a PoP type semiconductor package is not quickly dissipated, the heat may be accumulated in the lower package, thereby damaging the lower package or affecting the performance thereof.

SUMMARY

Inventive concepts provide a semiconductor package capable of smoothly dissipating heat generated from a semiconductor device.

Inventive concepts also provide a package-on-package (PoP) type package capable of smoothly dissipating heat generated from a semiconductor device located at a lower part thereof.

According to an embodiment of inventive concepts, a semiconductor package includes a first package substrate; a first semiconductor device on the first package substrate; a second package substrate on an upper part of the first semiconductor device; and a heat-dissipating material layer between the first semiconductor device and the second package substrate. The heat-dissipating material layer has a thermal conductivity of approximately 0.5 W/m·K to approximately 20 W/m·K. The heat-dissipating material layer is in direct contact with an upper surface of the first semiconductor device and a conductor of the second package substrate.

According to another embodiment of inventive concepts, a package-on-package (PoP) type package includes a first package, a second package on an upper part of the first package, and a heat-dissipating material layer. The first package includes a first semiconductor device on a first package substrate. The second package includes a second semiconductor device on a second package substrate. The second package substrate includes: a core layer; an upper wiring extending on an upper surface of the core layer; a lower wiring extending on a lower surface of the core layer; an upper insulator layer covering the upper surface of the core layer and at least a portion of the upper wiring; and a lower insulator layer covering the lower surface of the core layer and at least a portion of the lower wiring. The heat-dissipating material layer is in physical contact with the exposed lower wiring through the lower insulator layer and an upper surface of the first semiconductor device. The lower insulator layer exposes the lower wiring at least partially to provide an exposed lower wiring.

According to another embodiment of inventive concepts, a package-on-package (PoP) type package including a first package, a second package on an upper part of the first package, and a heat-dissipating material layer between the first package substrate and the second package substrate. The first package includes a first semiconductor device on a first package substrate. The second package includes a second semiconductor device on a second package substrate. The first package substrate includes a first core layer, a first upper pad on an upper part of the first core layer, and a first lower pad on a lower part of the first core layer. The second package substrate includes a second core layer; a second upper pad on an upper part of the second core layer; a second lower pad on a lower part of the second core layer; a lower wiring extending on the lower part of the second core layer; a lower insulator layer forming a lower surface of the second package substrate while exposing the lower wiring at least partially to provide an exposed lower wiring. The heat-dissipating material layer includes a polymer matrix and insulating inorganic particles dispersed in the polymer matrix. A thermal conductivity of the insulating inorganic particles is 10 times a thermal conductivity of the lower insulator layer or greater, and the heat-dissipating material layer is in physical contact with the exposed lower wiring of the second package substrate and an upper surface of the first semiconductor device.

BRIEF DESCRIPTION OF THE DRAWINGS

Embodiments of inventive concepts will be more clearly understood from the following detailed description taken in conjunction with the accompanying drawings in which.

DETAILED DESCRIPTION

Figure 1:
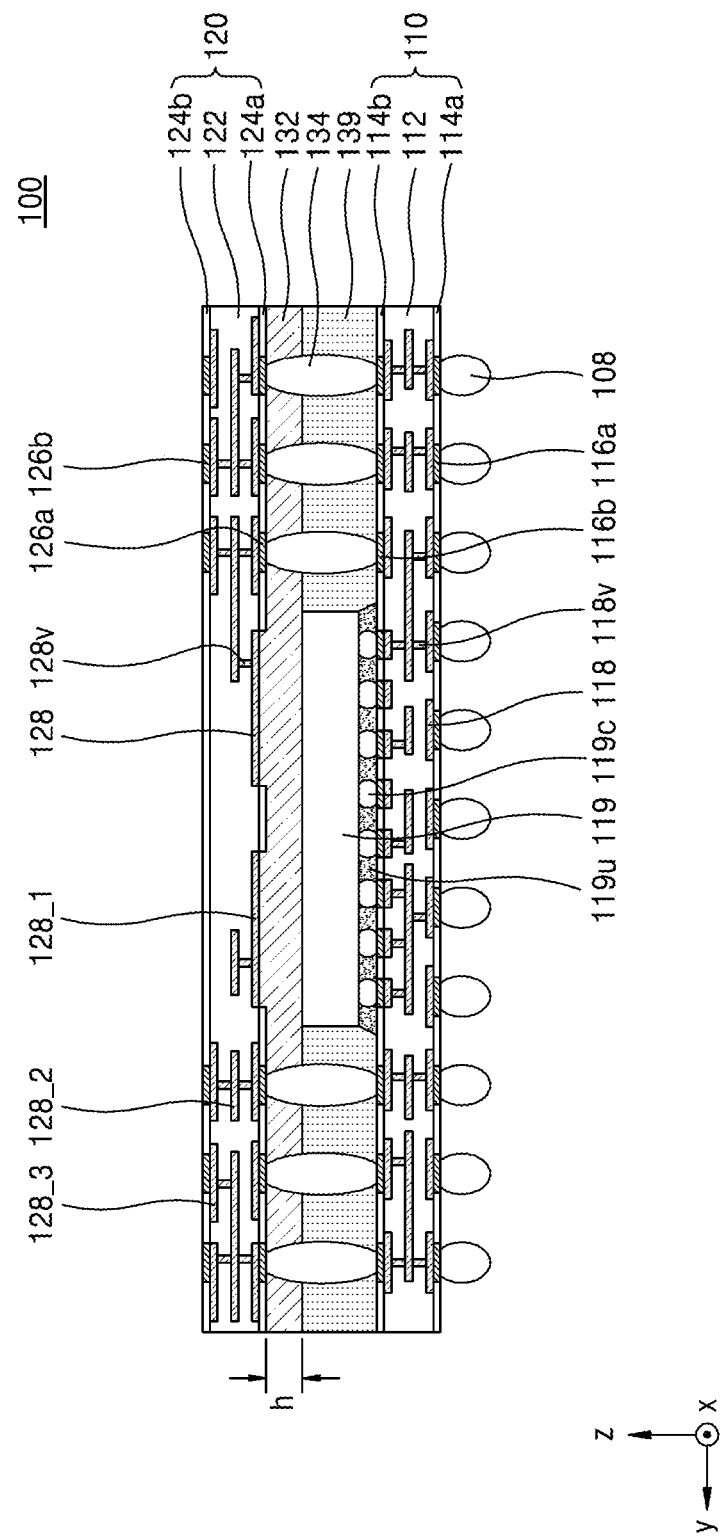
FIG. 1 is a side view of a semiconductor package according to an embodiment of inventive concepts.

Hereinafter, embodiments of inventive concepts will be described in detail with reference to the accompanying drawings. Like reference numerals in the drawings denote like elements, and thus their repetitive description will be omitted.

FIG. 1 is a side view of a semiconductor package 100 according to an embodiment of inventive concepts.

Referring to FIG. 1, the semiconductor package 100 may include a first package substrate 110, a first semiconductor device 119 mounted on the first package substrate 110, and a second package substrate 120.

The first package substrate 110 includes a first core layer 112, a first upper insulator layer 114b arranged at an upper part of the first core layer 112, and a first lower insulator layer 114a arranged at a lower part of the first core layer 112. In addition, the first package substrate 110 may further include first upper pads 116b exposed through the first upper insulator layer 114b, and first lower pads 116a exposed through the first lower insulator layer 114a.

The first core layer 112 may include at least one material selected from among a phenol resin, an epoxy resin, and polyimide. The first core layer 112 may include at least one material selected from among, for example, flame retardant 4 (FR4), tetrafunctional epoxy, polyphenylene ether, epoxy/polyphenylene oxide, bismaleimide triazine (BT), thermount, cyanate ester, polyimide, and a liquid crystal polymer.

The first upper insulator layer 114b through which the first upper pads 116b are exposed is provided at the upper part of the first core layer 112. The first upper insulator layer 114b may include, for example, a solder resist. According to some embodiments of inventive concepts, the first upper insulator layer 114b may include an epoxy-based resin.

The first lower insulator layer 114a through which the first lower pads 116a are exposed is provided at the lower part of the first core layer 112. The first lower insulator layer 114a may include, for example, a solder resist. According to some embodiments of inventive concepts, the first lower insulator layer 114a may include an epoxy-based resin.

An external connection terminal 108 may be connected to the first lower pads 116a. A first connection terminal 134 electrically connecting the first package substrate 110 to the second package substrate 120 may be connected to the first upper pads 116b. Each of the first lower pads 116a and the first upper pads 116b may include, for example, aluminum (Al), copper (Cu), nickel (Ni), cobalt (Co), zinc (Zn), gold (Au), silver (Ag), platinum (Pt), or an alloy thereof.

Each of the external connection terminal 108 and the first connection terminal 134 may include a bump or a solder ball. According to some embodiments of inventive concepts, the first connection terminal 134 may include a conductor pillar.

The first package substrate 110 may include a wiring pattern 118 electrically connecting the first lower pads 116a to the first upper pads 116b, and a conductive via 118v electrically connecting between the wiring pattern 118. The wiring pattern 118 may be arranged on an upper surface, on a lower surface and/or in the inside of the first core layer 112. The wiring pattern 118 may include, for example, an electrolytically deposited (ED) Cu foil, a rolled-annealed (RA) Cu foil, a stainless steel foil, an Al foil, an ultra-thin Cu foil, sputtered Cu, a Cu alloy, or the like.

The conductive via 118v may pass through at least a portion of the first core layer 112. According to some embodiments of inventive concepts, the conductive via 118v may include Cu, Ni, stainless steel, or beryllium Cu.

The first semiconductor device 119 may be mounted on the first package substrate 110. The first semiconductor device 119 may include processing circuitry such as, for example, a logic chip such as a central processing unit (CPU) chip, a graphics processing unit (GPU) chip, or an application processor (AP) chip. According to some embodiments of inventive concepts, the first semiconductor device 119 may include, for example, a dynamic random access memory (DRAM) chip, a static random access memory (SRAM) chip, a flash memory chip, an electrically erasable and programmable read-only memory (EEPROM) chip, a phase-change random access memory (PRAM) chip, a magnetic random access memory (MRAM) chip, or a resistive random access memory (RRAM) chip.

The first semiconductor device 119 may be connected to the first package substrate 110 through a second connection terminal 119c. The second connection terminal 119c may include a bump or a solder ball.

A space between the first semiconductor device 119 and the first package substrate 110 may be filled with an underfill material layer 119u encompassing the second connection terminal 119c. The underfill material layer 119u may include, for example, an epoxy resin formed by a capillary underfill method. According to some embodiments of inventive concepts, the underfill material layer 119u may include a non-conductive film (NCF).

The second package substrate 120 includes a second core layer 122, a second upper insulator layer 124b arranged at an upper part of the second core layer 122, and a second lower insulator layer 124a arranged at a lower part of the second core layer 122. In addition, the second package substrate 120 may further include second upper pads 126b exposed through the second upper insulator layer 124b, and second lower pads 126a exposed through the second lower insulator layer 124a.

The second core layer 122 may include at least one material selected from among a phenol resin, an epoxy resin, and polyimide. The second core layer 122 may include at least one material selected from among, for example, FR4, tetrafunctional epoxy, polyphenylene ether, epoxy/polyphenylene oxide, BT, thermount, cyanate ester, polyimide, and a liquid crystal polymer.

The second upper insulator layer 124b through which the second upper pads 126b are exposed is provided at the upper part of the second core layer 122. The second upper insulator layer 124b may include, for example, a solder resist. According to some embodiments of inventive concepts, the second upper insulator layer 124b may include an epoxy-based resin.

The second lower insulator layer 124a through which the second lower pads 126a are exposed is provided at the lower part of the second core layer 122. The second lower insulator layer 124a may include, for example, a solder resist. According to some embodiments of inventive concepts, the second lower insulator layer 124a may include an epoxy-based resin. This will be descried in more detail below.

The first connection terminal 134 may be connected to the second lower pads 126a. A connection terminal of another semiconductor device to be arranged at an upper part of the second upper pads 126b may be connected to the second upper pads 126b as described below. Each of the second lower pads 126a and the second upper pads 126b may include, for example, Al, Cu, Ni, Co, Zn, Au, Ag, Pt, or an alloy thereof.

The first connection terminal 134 may include a bump or a solder ball. According to some embodiments of inventive concepts, the first connection terminal 134 may include a conductor pillar.

The second package substrate 120 may include a wiring pattern 128 electrically connecting the second lower pads 126a to the second upper pads 126b, and a conductive via 128v electrically connecting between the wiring pattern 128. The wiring pattern 128 may be arranged on an upper surface, on a lower surface and/or in the inside of the second core layer 122. The wiring pattern 128 may include, for example, an ED Cu foil, an RA Cu foil, a stainless steel foil, an Al foil, an ultra-thin Cu foil, sputtered Cu, a Cu alloy, or the like.

The conductive via 128v may pass through at least a portion of the second core layer 122. According to some embodiments of inventive concepts, the conductive via 128v may include Cu, Ni, stainless steel, or beryllium Cu.

The second lower insulator layer 124a exposes the second lower pads 126a therethrough and partially exposes the wiring pattern 128 therethrough.

Figure 2:
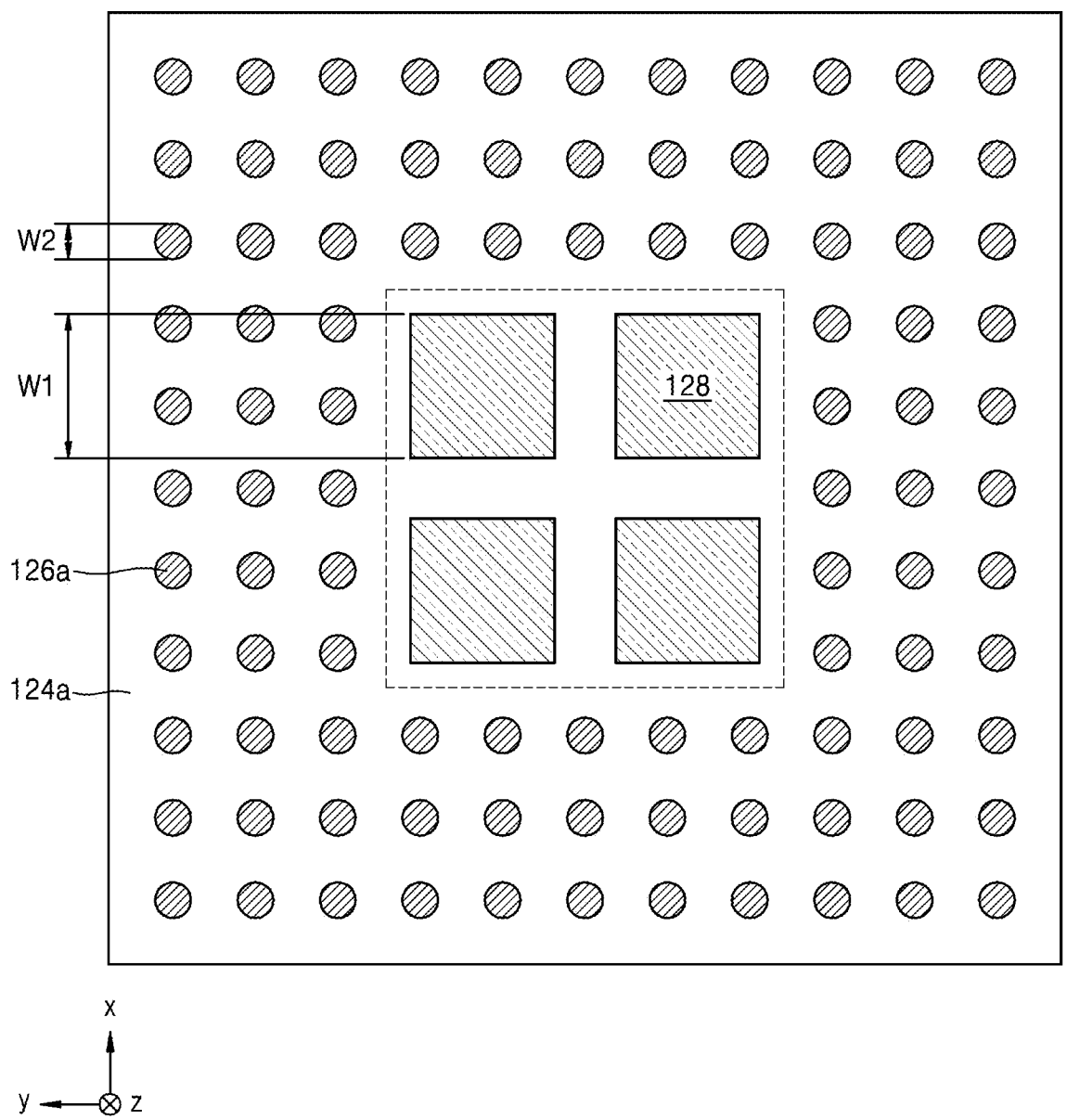
FIG. 2 is a top view of a wiring pattern exposed through a second lower insulator layer according to an embodiment of inventive concepts.

FIG. 2 is a top view of the wiring pattern 128 exposed through the second lower insulator layer 124a.

Referring to FIGS. 1 and 2, the wiring pattern 128 may be directly or indirectly connected to the second upper pad 126b and/or the second lower pad 126a. As described above, the wiring pattern 128 may be arranged on the upper surface, on the lower surface, and/or inside the second core layer 122, but although it is shown that the wiring pattern 128 is formed at each of three levels, it will be understood by those of ordinary skill in the art that a wiring pattern may be formed only at two levels, on the upper surface and the lower surface of the second core layer 122, or formed at, for example, four, five, six, or seven levels.

In the embodiment shown in FIGS. 1 and 2, an upper wiring pattern 128_3 provided to the top level among wiring patterns 128_1, 128_2, and 128_3 arranged at three levels may extend on an upper surface of the second core layer 122. A central wiring pattern 128_2 provided to an intermediate level among the wiring patterns 128_1, 128_2, and 128_3 arranged at the three levels may extend in a direction parallel to an xy plane inside the second core layer 122.

In addition, a lower wiring pattern 128_1 provided to the bottom level among the wiring patterns 128_1, 128_2, and 128_3 arranged at the three levels may extend on a lower surface of the second core layer 122 and may be located at a different level from that of the second lower pad 126a. That is, the second lower pad 126a is exposed without being covered by the second lower insulator layer 124a such that the second lower pad 126a is connectable to the first connection terminal 134. A lower surface of the second lower pad 126a, e.g., a surface facing the first connection terminal 134 may be closer to the first package substrate 110 than a lower surface of the second lower insulator layer 124a, e.g., a surface facing the first semiconductor device 119.

A lower surface of the lower wiring pattern 128_1 provided to the bottom level in the second package substrate 120, e.g., a surface facing the first semiconductor device 119, may be farther from the first package substrate 110 than or located substantially on the same plane as an upper surface of the second lower insulator layer 124a, e.g., a surface facing the second core layer 122.

According to some embodiments of inventive concepts, at least some of lower wiring patterns 128_1 may be appropriately distributed and provided to be connected to the second lower pads 126a. According to some embodiments of inventive concepts, at least some of the lower wiring patterns 128_1 may be arranged in a center portion of the second package substrate 120 with a relatively wide plan area for the purpose of a power source or the ground.

Although FIG. 1 shows that lower wiring patterns 128_1 arranged in the center portion among the lower wiring patterns 128_1 are entirely exposed through the second lower insulator layer 124a all over the plan area, the second lower insulator layer 124a may expose therethrough only a portion of the plan area of the lower wiring pattern 128_1.

Because the second lower insulator layer 124a may be formed by, for example, a silkscreen method or the like, the second lower insulator layer 124a may be formed in any pattern desired. Likewise, the first lower insulator layer 114a, the first upper insulator layer 114b, and the second upper insulator layer 124b may be formed in the same manner.

A dimension of the lower wiring pattern 128_1, exposed through the second lower insulator layer 124a, extending in the direction parallel to the xy plane may be greater than a dimension of the second lower pads 126a in the same direction. According to some embodiments of inventive concepts, a dimension W1 of the lower wiring pattern 128_1 in, for example, a first direction (x-axis direction) may be approximately 2.5 times to approximately 100 times, approximately 3 times to approximately 95 times, approximately 4 times to approximately 90 times, approximately 5 times to approximately 85 times, approximately 6 times to approximately 80 times, approximately 7 times to approximately 75 times, approximately 8 times to approximately 70 times, approximately 9 times to approximately 65 times, or approximately 10 times to approximately 60 times a dimension W2 of the second lower pad 126a in the first direction.

When the dimension W1 of the lower wiring pattern 128_1 in the first direction is not sufficiently greater than the dimension W2 of the second lower pad 126a in the first direction, e.g., when a difference therebetween is slight, contribution of the lower wiring pattern 128_1 to discharge heat may be insufficient as described below. On the contrary, when the dimension W1 of the lower wiring pattern 128_1 in the first direction is too greater than the dimension W2 of the second lower pad 126a in the first direction, a total area of the second package substrate 120 may be inefficiently used.

A total plan area of the lower wiring pattern 128_1 at least partially exposed through the second lower insulator layer 124a is way greater than a plan area of the second lower pad 126a. Herein, the total plan area of the lower wiring pattern 128_1 indicates a plan area of the lower wiring pattern 128_1 including both a part exposed through the second lower insulator layer 124a and a non-exposed part.

According to some embodiments of inventive concepts, the plan area of the lower wiring pattern 128_1 projected onto the xy plane may be approximately 5 times to approximately 10,000 times, approximately 10 times to approximately 9,000 times, approximately 20 times to approximately 8,000 times, approximately 30 times to approximately 7,000 times, approximately 40 times to approximately 6,000 times, approximately 60 times to approximately 4,000 times, approximately 100 times to approximately 2,000 times, or approximately 200 times to approximately 1,000 times the plan area of the second lower pad 126a projected onto the xy plane.

When the plan area of the lower wiring pattern 128_1 on the xy plane is not sufficiently greater than the plan area of the second lower pad 126a on the xy plane, e.g., when a difference therebetween is slight, contribution of the lower wiring pattern 128_1 to discharge heat may be insufficient as described below. On the contrary, when the plan area of the lower wiring pattern 128_1 on the xy plane is too greater than the plan area of the second lower pad 126a on the xy plane, a total area of the second package substrate 120 may be inefficiently used.

Referring to FIG. 1, a heat-dissipating material layer 132 may be between the first semiconductor device 119 and the second package substrate 120.

The heat-dissipating material layer 132 may include an arbitrary material having a higher thermal conductivity than the second lower insulator layer 124a, e.g., a composition in which insulating inorganic particles are dispersed in a polymer matrix. According to some embodiments of inventive concepts, the inorganic particle may be a metal oxide, a metalloid oxide, a metal nitride, or a metalloid nitride.

The thermal conductivity of the heat-dissipating material layer 132 may be approximately 2 times or more, approximately 5 times or more, approximately 10 times or more, approximately 15 times or more, approximately 20 times or more, or approximately 30 times or greater than the thermal conductivity of the second lower insulator layer 124a. When the thermal conductivity of the heat-dissipating material layer 132 is too low, an effect of discharging heat generated from the first semiconductor device 119 may be insufficient. There is no particular upper limit of the thermal conductivity of the heat-dissipating material layer 132, but the upper limit of the thermal conductivity of the heat-dissipating material layer 132 may be within, approximately 1,000 times the thermal conductivity of the second lower insulator layer 124a.

According to some embodiments of inventive concepts, the thermal conductivity of the heat-dissipating material layer 132 may be within a range of approximately 0.5 W/m·K to approximately 20 W/m·K, approximately 1.0 W/m·K to approximately 18 W/m·K, approximately 1.5 W/m·K to approximately 16 W/m·K, approximately 2.0 W/m·K to approximately 14 W/m·K, approximately 2.5 W/m·K to approximately 12 W/m·K, approximately 3.0 W/m·K to approximately 10 W/m·K, or approximately 3.5 W/m·K to approximately 8 Wm·K.

The polymer matrix may include, for example, an epoxy resin, polyimide, polyester, polystyrene, polyethylene terephthalate, high-density polyethylene, low-density polyethylene, polyurethane, polybenzoxazine, polyvinylidene fluoride (PVdF), or the like but is not limited thereto.

The insulating inorganic particle may include, for example, silica, a silicon nitride, a silicon carbide, alumina, titania, zirconia, ceria, an aluminum nitride (AlN), a boron nitride (BN), nano-diamond, or the like but is not limited thereto. The insulating inorganic particle may increase the thermal conductivity of the heat-dissipating material layer 132 and may be, for example, an arbitrary inorganic particle having a thermal conductivity of 20 W/m·K or more and having an excellent mixing property with the polymer matrix.

A content of the insulating inorganic particles in the heat-dissipating material layer 132 may be approximately 20 volume % to approximately 85 volume %. According to some embodiments of inventive concepts, the content of the insulating inorganic particles in the heat-dissipating material layer 132 may be approximately 25 volume % to approximately 80 volume %, approximately 30 volume % to approximately 75 volume %, approximately 35 volume % to approximately 70 volume %, approximately 40 volume % to approximately 65 volume %, or approximately 45 volume % to approximately 60 volume %.

When the content of the insulating inorganic particles in the heat-dissipating material layer 132 is too low, the thermal conductivity may be too low to make a sufficient heat-dissipating effect. When the content of the insulating inorganic particles in the heat-dissipating material layer 132 is too high, processability may be bad, and the dispersibility of the inorganic particles may be bad, thereby making manufacturing difficult.

As shown in FIG. 1, the heat-dissipating material layer 132 is in contact with the lower surface of the lower wiring pattern 128_1 and also is in contact with an upper surface of the first semiconductor device 119. Heat generated from the first semiconductor device 119 may be transferred to the heat-dissipating material layer 132 and then quickly transferred to the lower wiring pattern 128_1.

According to the related art, in a moving path of the heat generated from the first semiconductor device 119, the existence of the second lower insulator layer 124a between the first semiconductor device 119 and the lower wiring pattern 128_1 acts as a bottleneck which decreases heat transfer efficiency. In other words, according to the related art, because the lower wiring pattern 128_1 is covered by the second lower insulator layer 124a, the heat transferred from the first semiconductor device 119 is necessarily transferred to the lower wiring pattern 128_1 through the second lower insulator layer 124a. In this case, because the thermal conductivity of the second lower insulator layer 124a is extremely low as approximately 0.15 W/m·K to approximately 0.25 W/m·K, the second lower insulator layer 124a acts as a bottleneck in heat transfer.

In the embodiment shown in FIG. 1, because the first semiconductor device 119 is thermally directly connected to the lower wiring pattern 128_1 through the heat-dissipating material layer 132 having a relatively high thermal conductivity, the embodiment shown in FIG. 1 may have a better heat-dissipating characteristic compared with the related art.

The heat-dissipating material layer 132 may come in contact with not only the lower wiring pattern 128_1 but also the lower surface of the second lower insulator layer 124a. Furthermore, the heat-dissipating material layer 132 may partially come in contact with the second lower pads 126a. In this case, the heat generated from the first semiconductor device 119 may sequentially pass through the heat-dissipating material layer 132 and the second lower pads 126a and be discharged through the lower wiring pattern 128_1 provided to another bottom.

According to some embodiments of inventive concepts, the heat-dissipating material layer 132 may encompass a side surface of the first connection terminal 134 by a first height h. According to some embodiments of inventive concepts, a side surface of the heat-dissipating material layer 132 may be aligned to be substantially coplanar with a side surface of the first package substrate 110. According to some embodiments of inventive concepts, the side surface of the heat-dissipating material layer 132 may be aligned to be substantially coplanar with a side surface of the second package substrate 120. According to some embodiments of inventive concepts, the side surface of the heat-dissipating material layer 132 may be exposed to the outside of the semiconductor package 100.

According to some embodiments of inventive concepts, an encapsulation layer 139 may be further provided between the heat-dissipating material layer 132 and the first package substrate 110. That is, with respect to a remaining height of the first connection terminal 134 excluding the first height h, the encapsulation layer 139 may encompass the side surface of the first connection terminal 134.

The encapsulation layer 139 may include a polymer material such as an epoxy molding compound (EMC). The encapsulation layer 139 may not include such inorganic particles as mixed in the heat-dissipating material layer 132.

Figure 3A:
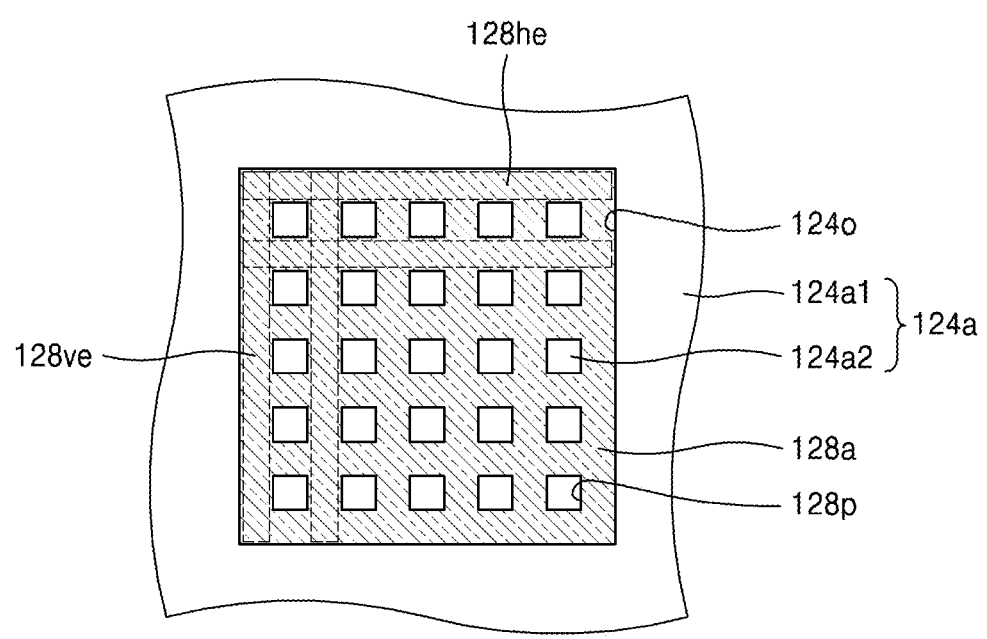
FIGS. 3A to 3C are partial top views of wiring patterns according to other embodiments of inventive concepts.

FIG. 3A is a partial top view of a wiring pattern 128a according to another embodiment of inventive concepts. The wiring pattern 128a partially shown in FIG. 3A corresponds to a central region of the second package substrate 120 of FIG. 2.

Referring to FIG. 3A, the wiring pattern 128a may have a mesh shape. That is, the wiring pattern 128a may include a plurality of horizontal extension parts 128he (also referred to as first extension portions) extending in a horizontal direction of FIG. 3A. In addition, the wiring pattern 128a may include a plurality of vertical extension parts 128ve (also referred to as second extension portions) extending in a vertical direction of FIG. 3A. The plurality of horizontal extension parts 128he and the plurality of vertical extension parts 128ve may intersect with each other, thereby generally forming the mesh-shaped wiring pattern 128a.

The second lower insulator layer 124a partially shown in FIG. 3A may have an opening 124o to expose the wiring pattern 128a therethrough. The opening 124o may be encompassed by a first part 124a1 of the second lower insulator layer 124a.

The wiring pattern 128a may include a plurality of perforated portions 128p passing through the wiring pattern 128a by the whole thickness. Islands of the second lower insulator layer 124a may be arranged on the perforated portions 128p, and the islands may form a second part 124a2 of the second lower insulator layer 124a.

That is, the opening 124o may be defined by the first part 124a1 and the second part 124a2. It will be understood by those of ordinary skill in the art that the whole plan area or only a partial plan area of the wiring pattern 128a may be exposed through the opening 124o.

Figure 3B:
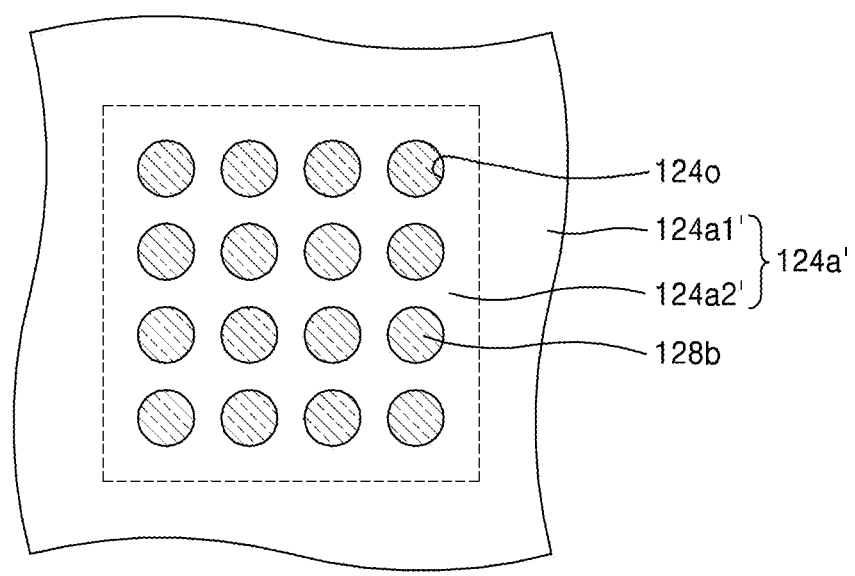

FIG. 3B is a partial top view of a wiring pattern 128b according to another embodiment of inventive concepts. The wiring pattern 128b partially shown in FIG. 3B corresponds to the central region of the second package substrate 120 of FIG. 2.

Referring to FIG. 3B, the wiring pattern 128b may have a flat plate shape. In this case, a second lower insulator layer 124a' may have a plurality of openings 124o through which the wiring pattern 128b is partially exposed. The plurality of openings 124o may be arranged in a grating shape. Although FIG. 3B shows that the opening 124o has a circular shape, it will be understood by those of ordinary skill in the art that the opening 124o may be formed in a different shape, e.g., a polygonal shape such as a triangular shape, a quadrangular shape, or a hexagonal shape, an oval shape, or another regular or irregular shape.

In the embodiment shown in FIG. 3B, the wiring pattern 128b may be exposed only partially by the second lower insulator layer 124a'. Therefore, the heat-dissipating material layer 132 may come in contact with the wiring pattern 128b only at portions exposed through the openings 124o. The second lower insulator layer 124a' may also include a first part 124a1' which does not overlap the wiring pattern 128b and a second part 124a2' which overlaps the wiring pattern 128b.

Figure 3C:
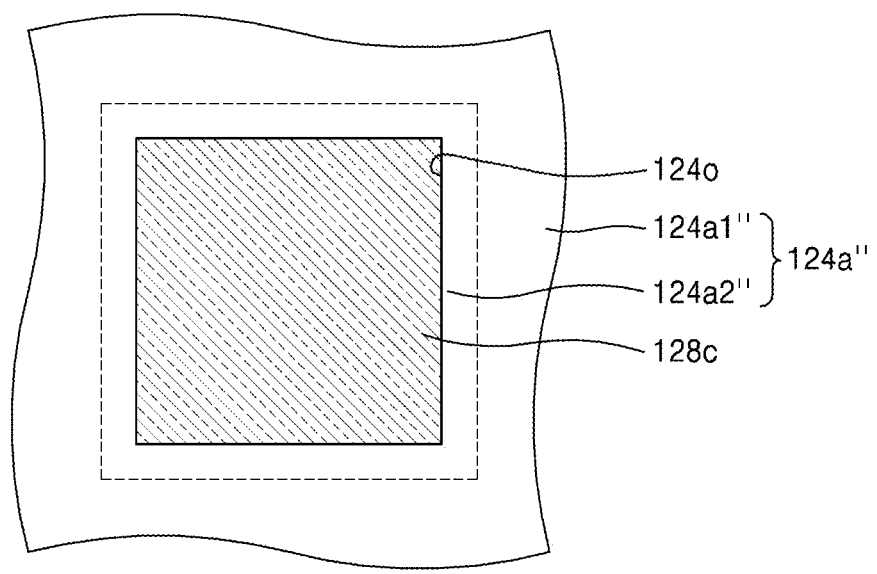

FIG. 3C is a partial top view of a wiring pattern 128c according to another embodiment of inventive concepts. The wiring pattern 128c partially shown in FIG. 3C corresponds to the central region of the second package substrate 120 of FIG. 2.

Referring to FIG. 3C, the wiring pattern 128c may have a flat plate shape. In this case, a second lower insulator layer 124a" may have a single opening 124o through which the wiring pattern 128b is partially exposed.

In the embodiment shown in FIG. 3C, the wiring pattern 128c may be exposed only partially by the second lower insulator layer 124a". Therefore, the heat-dissipating material layer 132 may come in contact with the wiring pattern 128c only at a portion exposed through the opening 124o. The second lower insulator layer 124a" may also include a first part 124a1" which does not overlap the wiring pattern 128c and a second part 124a2" which overlaps the wiring pattern 128c.

Figure 4:
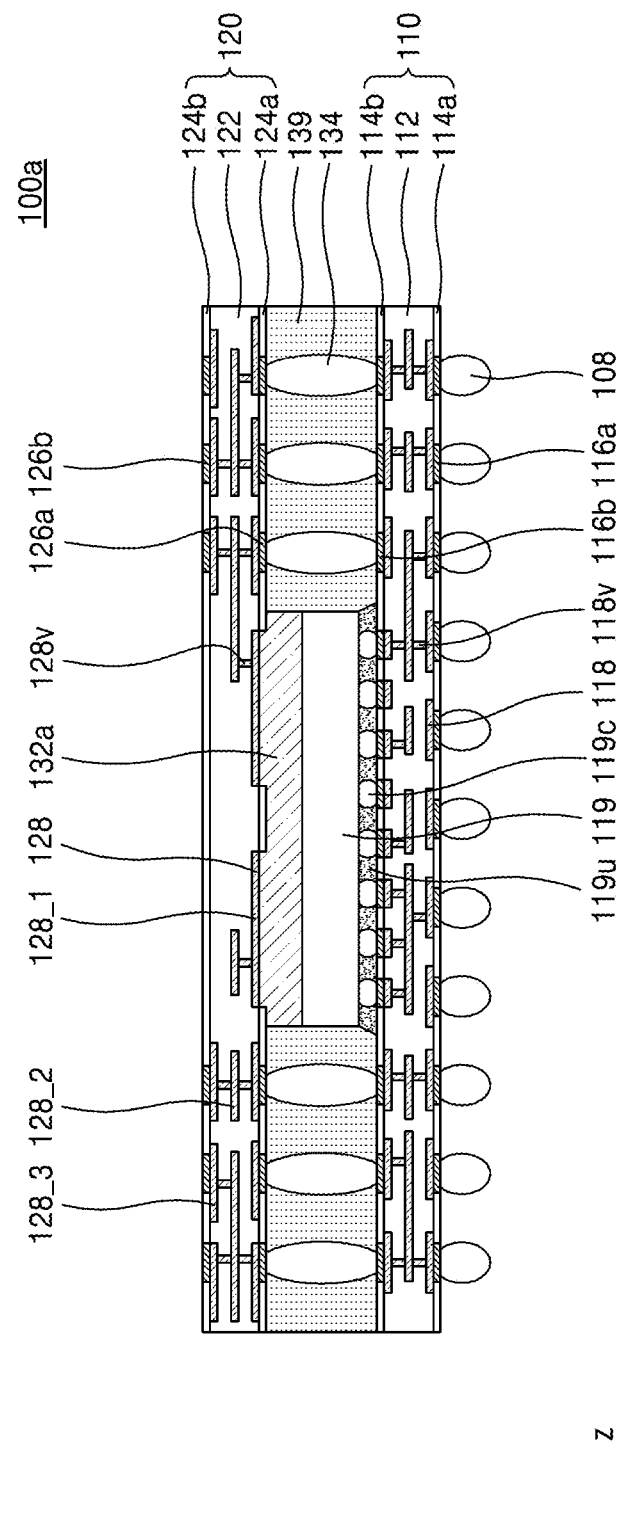
FIGS. 4 to 7 are side views of semiconductor packages according to other embodiments of inventive concepts.

FIG. 4 is a side view of a semiconductor package 100a according to another embodiment of inventive concepts.

The semiconductor package 100a shown in FIG. 4 differs from the semiconductor package 100 described with reference to FIG. 1 in that a side surface of a heat-dissipating material layer 132a does not extend up to a side surface of the semiconductor package 100a. Therefore, hereinafter, the difference is mainly described, and the description made above is not repeated.

Referring to FIG. 4, the heat-dissipating material layer 132a is not exposed to the outside of the semiconductor package 100a. According to some embodiments of inventive concepts, a side surface of the heat-dissipating material layer 132a may be substantially aligned with a side surface of the first semiconductor device 119. The heat-dissipating material layer 132a may not come in contact with a first connection terminal 134.

In this case, a whole side surface of the first connection terminal 134 may be encompassed by the encapsulation layer 139.

In addition, in this case, because the heat-dissipating material layer 132a does not extend from the side surface of the first semiconductor device 119 in a side direction, the heat-dissipating material layer 132a does not substantially come in contact with the first connection terminal 134. Therefore, the heat-dissipating material layer 132a may include a material having an electrical conductivity, e.g., a metal. Therefore, the heat-dissipating material layer 132a may include the same material as the heat-dissipating material layer 132 described with reference to FIG. 1 or include Cu, Al, Au, Ag, Pt, Fe, Co, Ni, Zn, or an alloy thereof. However, the heat-dissipating material layer 132a according to the present embodiment is not limited thereto. In this case, a thermal conductivity of the heat-dissipating material layer 132a may be approximately 70 W/m·K to approximately 450 Wm·K. For example, the thermal conductivity of the heat-dissipating material layer 132a may be approximately 200 W/m·K to approximately 440 W/m·K or approximately 300 W/m·K to approximately 430 Wm·K.

Figure 5:
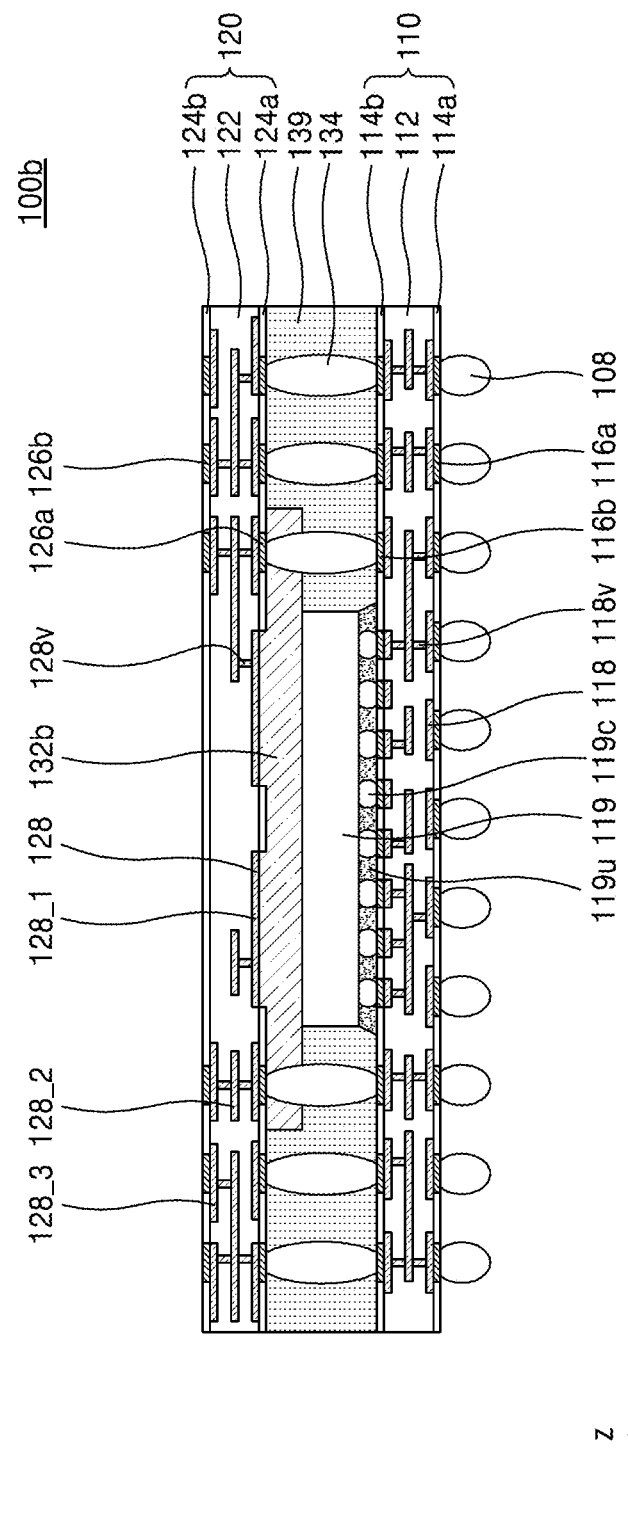

FIG. 5 is a side view of a semiconductor package 100b according to another embodiment of inventive concepts.

The semiconductor package 100b shown in FIG. 5 differs from the semiconductor package 100 described with reference to FIG. 1 in that a side surface of a heat-dissipating material layer 132b extends in the side direction beyond the side surface of the first semiconductor device 119 but does not extend up to a side surface of the semiconductor package 100b. Therefore, hereinafter, the difference is mainly described, and the description made above is not repeated.

Referring to FIG. 5, the heat-dissipating material layer 132b is not exposed to the outside of the semiconductor package 100b. According to some embodiments of inventive concepts, a side surface of the heat-dissipating material layer 132b may not be aligned with the side surface of the first semiconductor device 119 and may further extend in the side direction beyond the side surface of the first semiconductor device 119.

The heat-dissipating material layer 132b may partially come in contact with the first connection terminal 134. According to some embodiments of inventive concepts, the heat-dissipating material layer 132b may come in contact with some of a plurality of first connection terminals 134 and may not come in contact with the other first connection terminals 134.

When the heat-dissipating material layer 132b is in contact with the some first connection terminals 134, the heat-dissipating material layer 132b may encompass side surfaces of the some first connection terminals 134 by the first height h. With respect to a remaining height of the some first connection terminals 134 excluding the first height h, the encapsulation layer 139 may encompass the side surfaces of the some first connection terminals 134.

The whole side surfaces of the other first connection terminals 134 not in contact with the heat-dissipating material layer 132b may be encompassed by the encapsulation layer 139.

Figure 6:
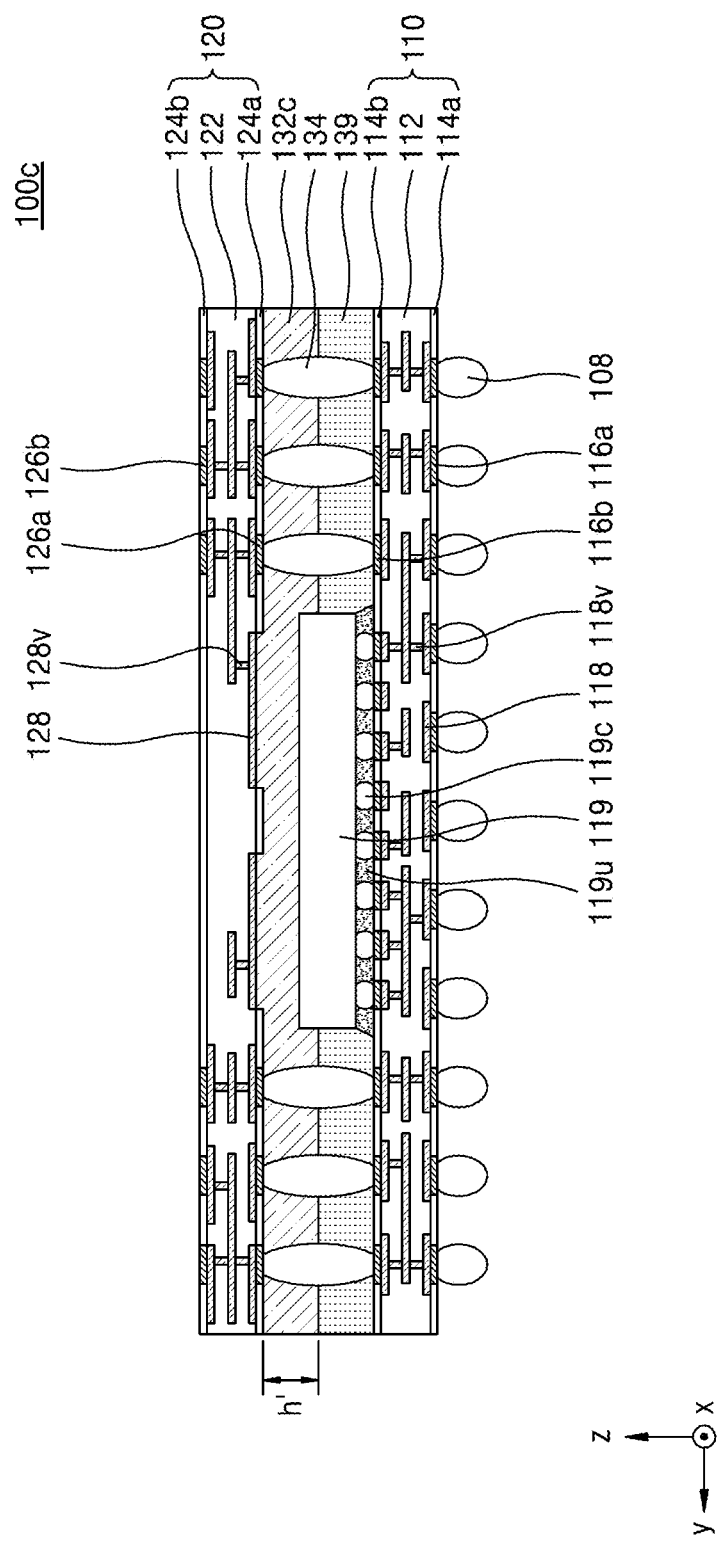

FIG. 6 is a side view of a semiconductor package 100c according to another embodiment of inventive concepts.

The semiconductor package 100c shown in FIG. 6 differs from the semiconductor package 100 described with reference to FIG. 1 in that a heat-dissipating material layer 132c is in at least partial contact with the side surface of the first semiconductor device 119. Therefore, hereinafter, the difference is mainly described, and the description made above is not repeated.

Referring to FIG. 6, the heat-dissipating material layer 132c may be thicker than the heat-dissipating material layer 132 in the embodiment described with reference to FIG. 1. Therefore, the heat-dissipating material layer 132c may encompass the side surface of the first connection terminal 134 by a second height h' greater than the first height h. With respect to a remaining height of the first connection terminal 134 excluding the second height h', the encapsulation layer 139 may encompass the side surface of the first connection terminal 134.

The heat-dissipating material layer 132c may come in at least partial contact with the side surface of the first semiconductor device 119. That is, a contact area of the heat-dissipating material layer 132c and the first semiconductor device 119 may be greater than a contact area in the embodiment described with reference to FIG. 1. Accordingly, the heat generated from the first semiconductor device 119 may be more quickly removed.

Figure 7:
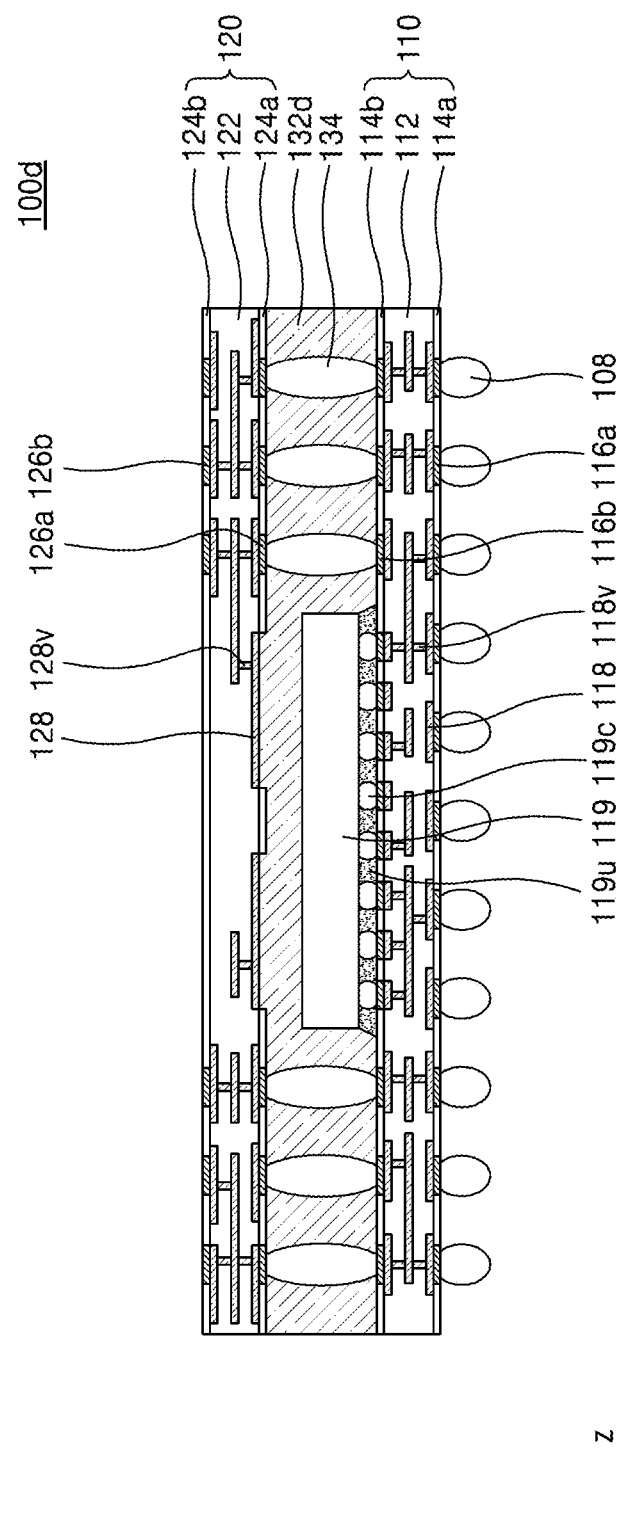

FIG. 7 is a side view of a semiconductor package 100d according to another embodiment of inventive concepts.

The semiconductor package 100d shown in FIG. 7 differs from the semiconductor package 100 described with reference to FIG. 1 in that a heat-dissipating material layer 132d also acts as an encapsulation layer. Therefore, hereinafter, the difference is mainly described, and the description made above is not repeated.

Referring to FIG. 7, the heat-dissipating material layer 132d may fill in a space between the first package substrate 110 and the second package substrate 120. That is, because the heat-dissipating material layer 132d also acts as an encapsulation layer, the encapsulation layer 139 in the embodiment described with reference to FIG. 1 is omitted.

Therefore, the heat-dissipating material layer 132d may encompass the side surface of the first connection terminal 134 by the whole height of the first connection terminal 134. In addition, the heat-dissipating material layer 132d may come in contact with at least a portion of an upper surface of the first package substrate 110. According to some embodiments of inventive concepts, the heat-dissipating material layer 132d may come in contact with the entire exposed upper surface of the first package substrate 110.

In addition, a contact area of the heat-dissipating material layer 132d and the first semiconductor device 119 may be greater than the contact area in the embodiment described with reference to FIG. 6. Accordingly, the heat generated from the first semiconductor device 119 may be more quickly removed.

Figure 8:
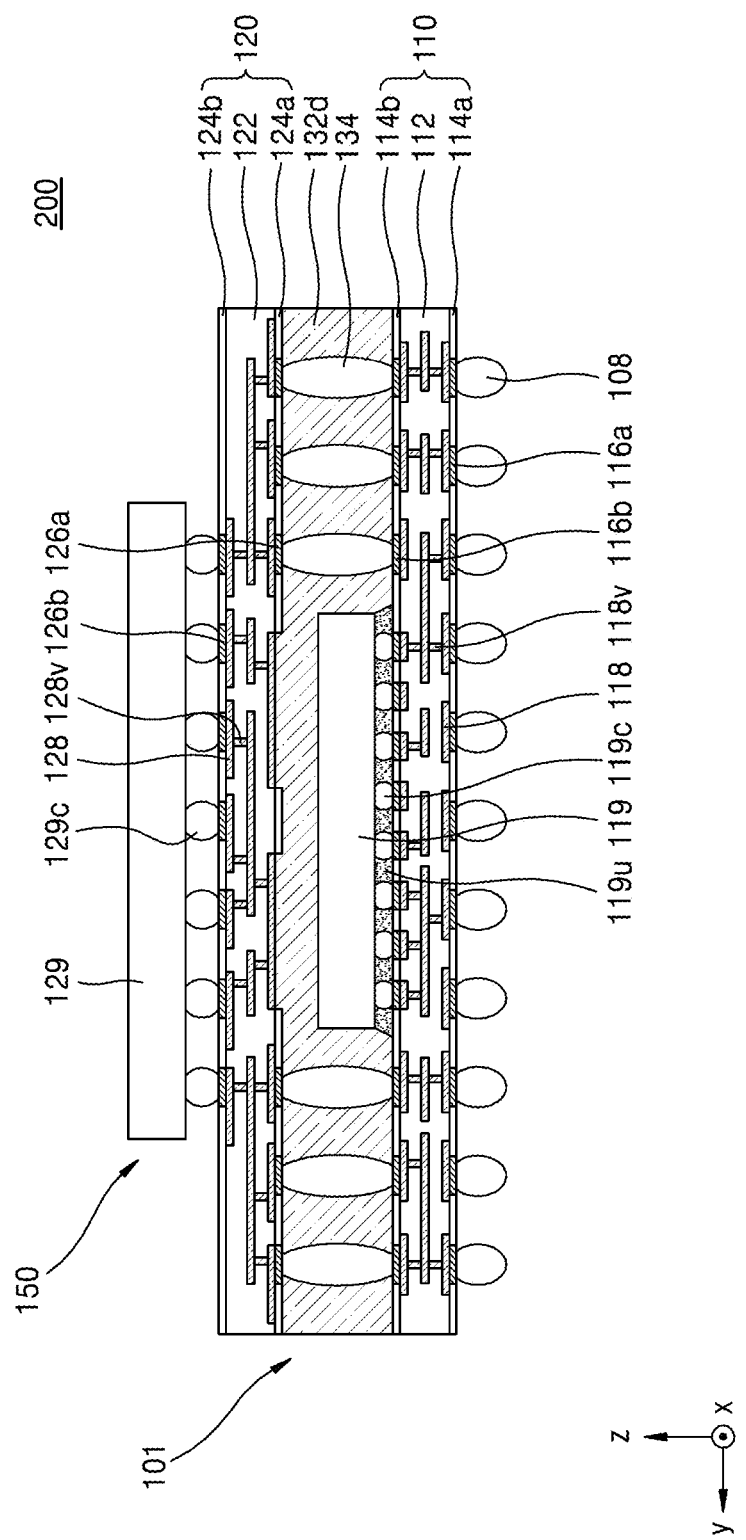
FIG. 8 is a side view of a package-on-package (PoP) type package according to an embodiment of inventive concepts.

FIG. 8 is a side view of a package-on-package (PoP) type package 200 according to an embodiment of inventive concepts.

Referring to FIG. 8, the PoP type package 200 may include a first package 101 and a second package 150 arranged on the first package 101.

The first package 101 may include the first package substrate 110 and the first semiconductor device 119 mounted on the first package substrate 110. The second package 150 may include the second package substrate 120 and a second semiconductor device 129 mounted on the second package substrate 120.

The first package substrate 110, the second package substrate 120, and the first semiconductor device 119 have been described in detail with reference to FIG. 1, and thus, an additional description thereof is omitted herein.

The second semiconductor device 129 may include processing circuitry such as, for example, a logic chip such as a CPU chip, a GPU chip, or an AP chip. According to some embodiments of inventive concepts, the second semiconductor device 129 may include, for example, a DRAM chip, an SRAM chip, a flash memory chip, an EEPROM chip, a PRAM chip, an MRAM chip, or an RRAM chip.

The second semiconductor device 129 may be a single chip or a single package.

When the second semiconductor device 129 is a single chip, a semiconductor element (e.g., chip) may be formed on an active surface of a semiconductor substrate. In the example shown in FIG. 8, a lower surface of the second semiconductor device 129 may be the active surface. The semiconductor substrate may be a silicon (Si) substrate. According to another embodiment of inventive concepts, the semiconductor substrate may include a semiconductor element such as germanium (Ge), or a compound semiconductor such as a silicon carbide (SiC), a gallium arsenide (GaAs), an indium arsenide (InAs), or an indium phosphide (InP).

When the second semiconductor device 129 is a single package, the second semiconductor device 129 may include a separate package substrate, and a semiconductor chip may be mounted on the package substrate. In this case, the second package substrate 120 may be named an interposer. In addition, a PoP in which the second semiconductor device 129 is a package may be referred to as an interposer PoP or abbreviated i-PoP. This will be described in more detail with reference to FIG. 9. The second semiconductor device 129 may be connected to the second package substrate 120 through a third connection terminal 129c. The third connection terminal 129c may include a bump or a solder ball.

When a semiconductor package according to inventive concepts is used, a PoP type package capable of smoothly discharging heat generated from a semiconductor device may be manufactured.

Figure 9:
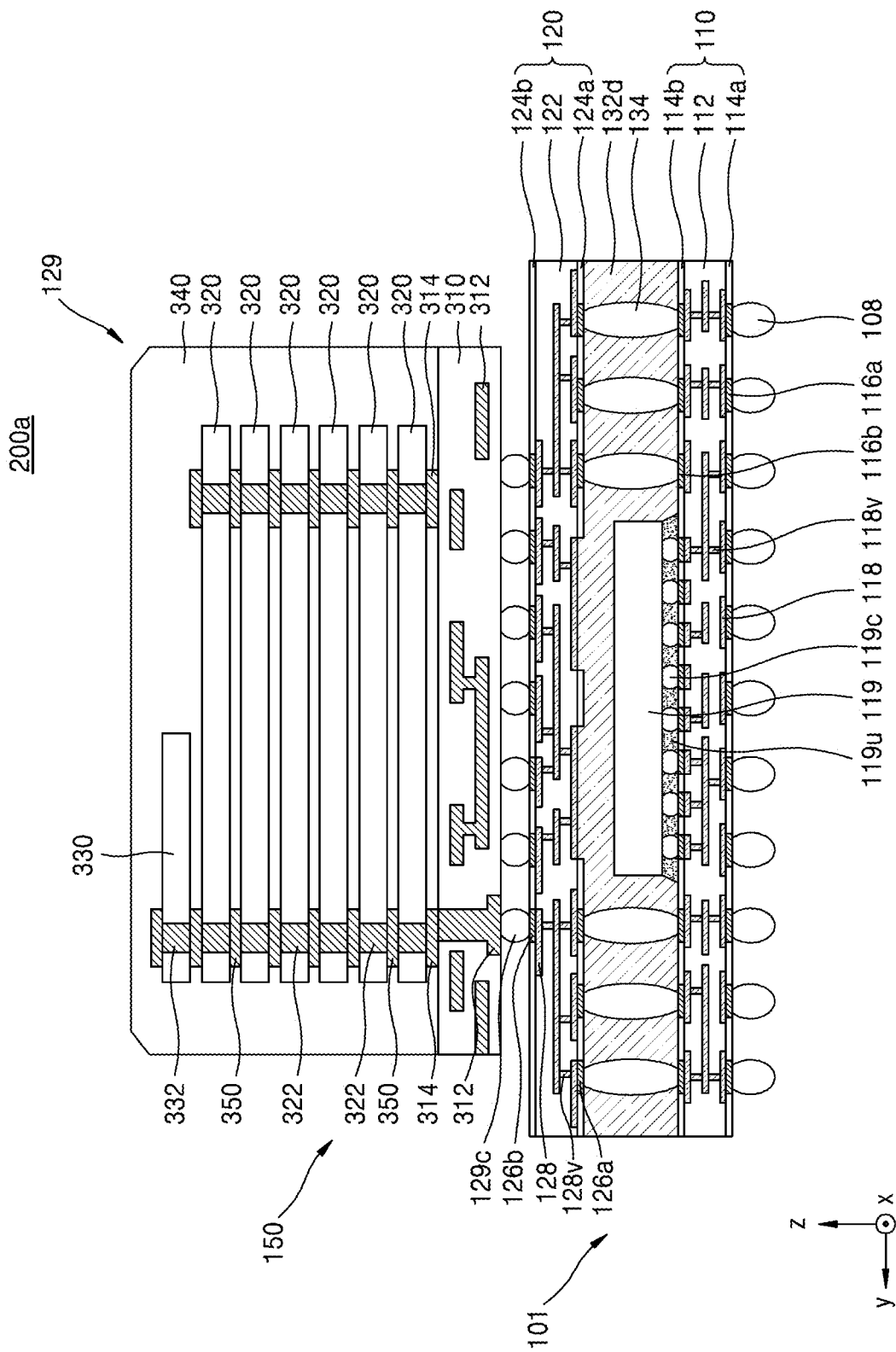
FIG. 9 is a side view of a PoP type package when a second semiconductor device is a single package according to an embodiment of inventive concepts.

FIG. 9 is a side view of a PoP type package 200a when the second semiconductor device 129 is a single package.

Referring to FIG. 9, the second semiconductor device 129 may include a plurality of semiconductor chips 320 sequentially stacked on a third package substrate 310. A memory control chip 330 may be connected onto the plurality of semiconductor chips 320. A stacked structure of the plurality of semiconductor chips 320 and the memory control chip 330 may be sealed by an encapsulant 340 such as a thermosetting resin on the third package substrate 310. Although FIG. 9 shows a structure in which six semiconductor chips 320 are vertically stacked, the number of semiconductor chips 320 and a stacking direction thereof are not limited thereto. The number of semiconductor chips 320 may be more or less than six in accordance with circumstances. The plurality of semiconductor chips 320 may be arranged on the third package substrate 310 in the horizontal direction or arranged in a connection structure in which vertical mounting and horizontal mounting are mixed. According to some embodiments of inventive concepts, the memory control chip 330 may be omitted.

The third package substrate 310 may include a flexible printed circuit board, a rigid printed circuit board, or a combination thereof. The third package substrate 310 may include a substrate internal wiring 312 and a connection terminal 314. The connection terminal 314 may be formed on one surface of the third package substrate 310. A third connection terminal 129c may be formed on the other surface of the third package substrate 310. The connection terminal 314 may be electrically connected to the third connection terminal 129c through the substrate internal wiring 312.

According to some embodiments of inventive concepts, the second semiconductor device 129 may include via structure units 322 and 332. The via structure units 322 and 332 may be electrically connected to the connection terminal 314 of the third package substrate 310 through a connection member 350 such as a bump. According to some embodiments of inventive concepts, the via structure unit 332 may be omitted from the memory control chip 330.

Each of the plurality of semiconductor chips 320 may include a system large-scale integration (LSI) chip, a flash memory, DRAM, SRAM, EEPROM, PRAM, MRAM, or RRAM. The memory control chip 330 may include logic circuits including, for example, a serializer/deserializer (SER/DES) circuit and the like.

Figure 10:
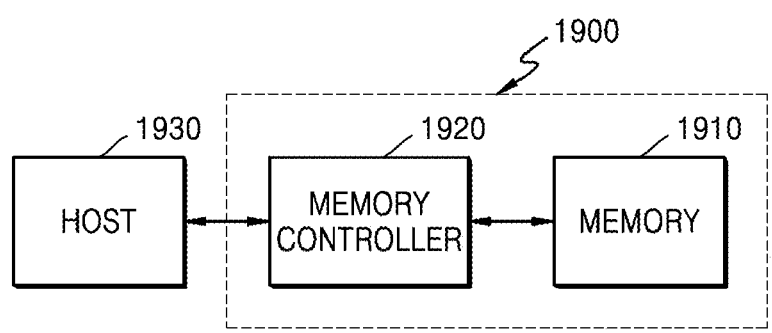
FIG. 10 is a block diagram of an electronic system according to embodiments of inventive concepts.

FIG. 10 is a block diagram of an electronic system 1900 according to embodiments of inventive concepts.

The electronic system 1900 may include a memory 1910 and a memory controller 1920. The memory controller 1920 controls the memory 1910 to read data from the memory 1910 and/or write data on the memory 1910, in response to a request from a host 1930. According to some embodiments of inventive concepts, the memory controller 1920 may be the first package 101 described with reference to FIG. 8, and the memory 1910 may be the second package 150 described with reference to FIG. 8.

Figure 11:
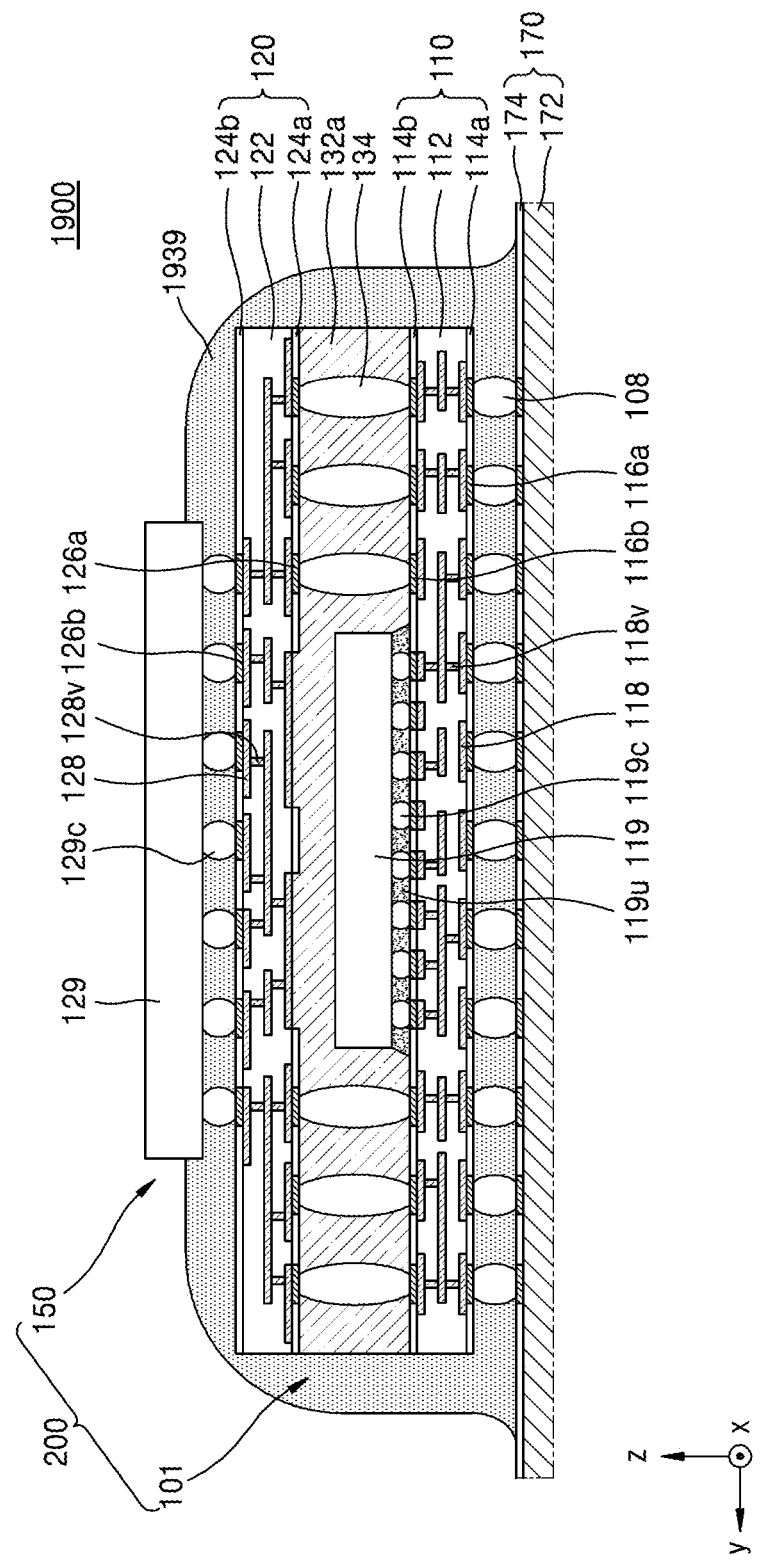
FIG. 11 is a side view of a portion of the electronic system according to an embodiment of inventive concepts.

FIG. 11 is a side view of a portion of the electronic system 1900.

Referring to FIGS. 10 and 11, the electronic system 1900 may include a mainboard 170 of the host 1930 and a PoP package 200 mounted on the mainboard 170. The PoP package 200 has been described with reference to FIG. 8, and thus, the description made above is not repeated herein.

The mainboard 170 may include a mainboard core layer 172 and a mainboard insulator layer 174 covering an upper surface of the mainboard core layer 172. The mainboard core layer 172 may include at least one material selected from among a phenol resin, an epoxy resin, and polyimide. The mainboard core layer 172 may include at least one material selected from among, for example, FR4, tetrafunctional epoxy, polyphenylene ether, epoxy/polyphenylene oxide, BT, thermount, cyanate ester, polyimide, and a liquid crystal polymer.

The mainboard insulator layer 174 may include, for example, a solder resist. According to some embodiments of inventive concepts, the mainboard insulator layer 174 may include an epoxy-based resin.

According to some embodiments of inventive concepts, the first package 101 and the second package substrate 120 in the PoP package 200 on the mainboard 170 may be encapsulated by an encapsulation layer 1939. According to some embodiments of inventive concepts, the encapsulation layer 1939 may be formed to expose therethrough an upper surface of the second semiconductor device 129.

While inventive concepts has been particularly shown and described with reference to embodiments thereof, it will be understood that various changes in form and details may be made therein without departing from the spirit and scope of the following claims.

What is claimed is:

1. A semiconductor package comprising:
   a first package substrate;
   a first semiconductor device on the first package substrate, the first semiconductor device being connected to the first package substrate via a first connection terminal;
   a second package substrate on an upper part of the first semiconductor device, the second package substrate including a conductor; and
   a heat-dissipating material layer between the first semiconductor device and the second package substrate, the heat-dissipating material layer having a thermal conductivity of approximately 0.5 W/m·K to approximately 20 W/m·K, and the heat-dissipating material layer being in direct contact with an upper surface of the first semiconductor device and the conductor of the second package substrate, wherein the second package substrate includes
   a lower pad connected to the first package substrate through a second connection terminal, the lower pad on a first surface of the second package substrate facing the first semiconductor device,
   a lower wiring on the first surface of the second package substrate, the lower wiring not connected to the first package substrate through the second connection terminal, and
   a lower insulator layer on the first surface of the second package substrate, the lower insulator layer exposing the lower pad and the lower wiring therethrough.

2. The semiconductor package of claim 1, wherein the conductor of the second package substrate is the lower wiring of the second package substrate.

3. The semiconductor package of claim 2, wherein
   an exposed portion of the lower wiring is exposed through an opening in the lower insulator layer, and
   the heat-dissipating material layer contacts the lower wiring over an entire area of the exposed portion of the lower wiring exposed.

4. The semiconductor package of claim 3, wherein
   the lower insulator layer includes a plurality of openings that expose a lower surface of the lower wiring, and
   the heat-dissipating material layer contacts the lower wiring through the plurality of openings.

5. The semiconductor package of claim 3, wherein the lower insulator layer includes:
   a first part encompassing a periphery of the opening; and
   a second part in a form of islands encompassed by and spaced apart from the first part, and
   the opening is defined by the first part and the second part.

6. The semiconductor package of claim 1, wherein a dimension of the lower wiring in a direction parallel to a lower surface of the second package substrate is approximately 2.5 times to approximately 100 times a dimension of the lower pad.

7. The semiconductor package of claim 1, wherein a plan area of the lower wiring projected onto the first surface of the second package substrate is approximately 5 times to approximately 10,000 times a plan area of the lower pad.

8. The semiconductor package of claim 7, wherein the lower wiring includes a perforated portion passing through the lower wiring.

9. The semiconductor package of claim 8, wherein the lower wiring includes two or more perforated portions.

10. The semiconductor package of claim 8, wherein the lower wiring includes:
a plurality of first extension portions extending in a first direction; and
a plurality of second extension portions overlapping the first extension portions and extending in a second direction.

11. The semiconductor package of claim 1, wherein
the heat-dissipating material layer includes a polymer matrix and insulating inorganic particles dispersed in the polymer matrix, and
the insulating inorganic particles include at least one of a metal oxide, a metalloid oxide, a metal nitride, and a metalloid nitride.

12. The semiconductor package of claim 1, wherein
the heat-dissipating material layer includes a polymer matrix and insulating inorganic particles dispersed in the polymer matrix, and
the insulating inorganic particles include silica, a silicon nitride, a silicon carbide, alumina, titania, zirconia, ceria, an aluminum nitride (AlN), a boron nitride (BN), or nano-diamond.

13. A package-on-package (PoP) type package comprising:
a first package, the first package including a first semiconductor device on a first package substrate, the first semiconductor device being connected to the first package substrate via a first connection terminal;
a second package on an upper part of the first package, the second package including a second semiconductor device on a second package substrate, the second package substrate being between the first semiconductor device and the second semiconductor device,
the second package substrate including a core layer, an upper wiring extending on an upper surface of the core layer, a lower wiring extending on a lower surface of the core layer, an upper insulator layer covering the upper surface of the core layer and at least a portion of the upper wiring, and a lower insulator layer covering the lower surface of the core layer and at least a portion of the lower wiring, the lower insulator layer at least partially exposing the lower wiring to provide an exposed lower wiring; and
a heat-dissipating material layer in physical contact with the exposed lower wiring through the lower insulator layer and an upper surface of the first semiconductor device.

14. The PoP type package of claim 13, further comprising:
a second connection terminal connecting the first package substrate to the second package substrate in a side direction of the first semiconductor device,
wherein the second package substrate further includes a lower terminal in contact with the second connection terminal at a lower part of the core layer, and
the first package substrate includes an upper terminal in contact with the second connection terminal.

15. The PoP type package of claim 14, wherein the heat-dissipating material layer encompasses a side surface of the second connection terminal.

16. The PoP type package of claim 15, wherein a side surface of the heat-dissipating material layer is coplanar with a side surface of the first package substrate.

17. The PoP type package of claim 16, wherein a side surface of the second package substrate is coplanar with the side surface of the heat-dissipating material layer.

18. The PoP type package of claim 13, wherein
the first semiconductor device is a logic chip, and
the second semiconductor device is a memory chip.

19. A package-on-package (PoP) type package comprising:
a first package,
the first package including a first semiconductor device on a first package substrate, the first semiconductor device being connected to the first package substrate via a first connection terminal,
the first package substrate including a first core layer, a first upper pad on an upper part of the first core layer, and a first lower pad on a lower part of the first core layer, and
a second package on an upper part of the first package, the second package including a second semiconductor device on a second package substrate, the second package substrate being between the first semiconductor device and the second semiconductor device,
the second package substrate including a second core layer, a second upper pad on an upper part of the second core layer, a second lower pad on a lower part of the second core layer, a lower wiring extending on the lower part of the second core layer, a lower insulator layer forming a lower surface of the second package substrate while exposing the lower wiring at least partially to provide an exposed lower wiring; and
a heat-dissipating material layer between the first package substrate and the second package substrate,
the heat-dissipating material layer including insulating inorganic particles dispersed in a polymer matrix,
a thermal conductivity of the insulating inorganic particles being 10 times a thermal conductivity of the lower insulator layer or greater, and
the heat-dissipating material layer is in physical contact with the exposed lower wiring of the second package substrate and an upper surface of the first semiconductor device.

* * * * *